(12) United States Patent
Singer et al.

(10) Patent No.: US 9,935,250 B2
(45) Date of Patent: Apr. 3, 2018

(54) OPTOELECTRONIC COMPONENT AND METHOD OF PRODUCTION THEREOF

(71) Applicant: OSRAM Opto Semiconductors Gmbh, Regensburg (DE)

(72) Inventors: Frank Singer, Regenstauf (DE); Jürgen Moosburger, Regensburg (DE); Thomas Schwarz, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/782,698

(22) PCT Filed: Apr. 3, 2014

(86) PCT No.: PCT/EP2014/056661
§ 371 (c)(1),
(2) Date: Oct. 6, 2015

(87) PCT Pub. No.: WO2014/166801
PCT Pub. Date: Oct. 16, 2014

(65) Prior Publication Data
US 2016/0093783 A1    Mar. 31, 2016

(30) Foreign Application Priority Data
Apr. 9, 2013  (DE) .................. 10 2013 206 225

(51) Int. Cl.
*H01L 33/62*  (2010.01)
*H01L 33/48*  (2010.01)
(Continued)

(52) U.S. Cl.
CPC ............ *H01L 33/62* (2013.01); *H01L 33/486* (2013.01); *H01L 33/502* (2013.01); *H01L 33/54* (2013.01); *H01L 2224/48091* (2013.01); *H01L 2224/48471* (2013.01); *H01L 2224/48479* (2013.01); *H01L 2224/49107* (2013.01);
(Continued)

(58) Field of Classification Search
None
See application file for complete search history.

(56) References Cited

U.S. PATENT DOCUMENTS

2004/0104391 A1*  6/2004  Maeda ................ C09K 11/025
257/79
2005/0045903 A1   3/2005  Abe et al.
(Continued)

FOREIGN PATENT DOCUMENTS

DE         101 05 872 A1     9/2002
DE     10 2005 010 311 A1    9/2006
(Continued)

*Primary Examiner* — Khaja Ahmad
(74) *Attorney, Agent, or Firm* — DLA Piper LLP (US)

(57) ABSTRACT

An optoelectronic component includes an optoelectronic semiconductor chip embodied as a volume emitter, wherein the optoelectronic semiconductor chip is embedded into an optically transparent molded body, a soldering contact is arranged at an underside of the molded body, a bonding wire forms an electrically conductive connection between an electrical contact area of the optoelectronic semiconductor chip and the soldering contact, and the bonding wire is embedded into the molded body.

9 Claims, 8 Drawing Sheets

(51) Int. Cl.
*H01L 33/50* (2010.01)
*H01L 33/54* (2010.01)
(52) U.S. Cl.
CPC ........... *H01L 2224/73265* (2013.01); *H01L 2224/8592* (2013.01); *H01L 2924/181* (2013.01); *H01L 2933/005* (2013.01); *H01L 2933/0033* (2013.01); *H01L 2933/0041* (2013.01); *H01L 2933/0066* (2013.01)

(56) References Cited

U.S. PATENT DOCUMENTS

| | | | | |
|---|---|---|---|---|
| 2009/0309116 | A1* | 12/2009 | Kato | C09K 11/7721 257/98 |
| 2010/0308365 | A1 | 12/2010 | Masuya et al. | |
| 2011/0316022 | A1 | 12/2011 | Hussell | |
| 2013/0049061 | A1* | 2/2013 | Takeda | H01L 33/486 257/99 |
| 2013/0056788 | A1* | 3/2013 | Haraguchi | H01L 33/486 257/99 |

FOREIGN PATENT DOCUMENTS

| | | |
|---|---|---|
| DE | 10 2009 036 621 A1 | 2/2011 |
| EP | 2 161 765 A2 | 3/2010 |

* cited by examiner

OPTOELECTRONIC COMPONENT AND METHOD OF PRODUCTION THEREOF

TECHNICAL FIELD

This disclosure relates to an optoelectronic component and a method of producing an optoelectronic component.

This application claims the priority of DE 10 2013 206 225.7, the disclosure content of which is hereby incorporated by reference.

BACKGROUND

DE 10 2009 036 621 A1 discloses a method of producing an optoelectronic semiconductor component in which optoelectronic semiconductor chips are arranged at a top side of a carrier. A molded body is molded around the optoelectronic semiconductor chips, the molded body covering all side surfaces of the optoelectronic semiconductor chips. Top sides and undersides of the optoelectronic semiconductor chips preferably remain free. The optoelectronic semiconductor components can be singulated after the carrier has been removed. Contact locations can be provided at the top side and/or underside of each semiconductor chip. The molded body can consist, for example, of an epoxide-based molding material.

Optoelectronic semiconductor chips comprising a sapphire substrate are known. In those semiconductor chips, electromagnetic radiation is emitted from the entire sapphire substrate in all spatial directions. Such semiconductor chips are therefore also designated as volume emitters.

SUMMARY

We provide an optoelectronic component including an optoelectronic semiconductor chip as a volume emitter, wherein the optoelectronic semiconductor chip is embedded into an optically transparent molded body, a soldering contact is arranged at an underside of the molded body, a bonding wire forms an electrically conductive connection between an electrical contact area of the optoelectronic semiconductor chip and the soldering contact, and the bonding wire is embedded into the molded body.

We also provide a method of producing an optoelectronic component including: providing a carrier having a depression formed at a top side of the carrier; arranging a first layer at a top side of the carrier; arranging a second layer above the first layer; arranging an optoelectronic semiconductor chip, as a volume emitter, on the second layer in the depression; producing an electrically conductive connection between an electrical contact area of the optoelectronic semiconductor chip and the second layer by a bonding wire; forming an optically transparent molded body above the second layer, wherein the optoelectronic semiconductor chip and the bonding wire are embedded into the molded body; releasing the molded body from the first layer; removing the second layer from the molded body; and arranging a soldering contact at an underside of the molded body, wherein the soldering contact electrically conductively connects to the bonding wire.

We further provide an optoelectronic component including an optoelectronic semiconductor chip as a volume emitter, wherein the optoelectronic semiconductor chip is embedded into an optically transparent molded body, a soldering contact is arranged at an underside of the molded body, a bonding wire forms an electrically conductive connection between an electrical contact area of the optoelectronic semiconductor chip and the soldering contact, the bonding wire is embedded into the molded body, the molded body has a pyramidal-frustum-shaped section, a lateral surface of the pyramidal-frustum-shaped section forms a part of the underside of the molded body, and the lateral surface is at least partly covered by the soldering contact.

LIST OF REFERENCE SIGNS

Figure 1:
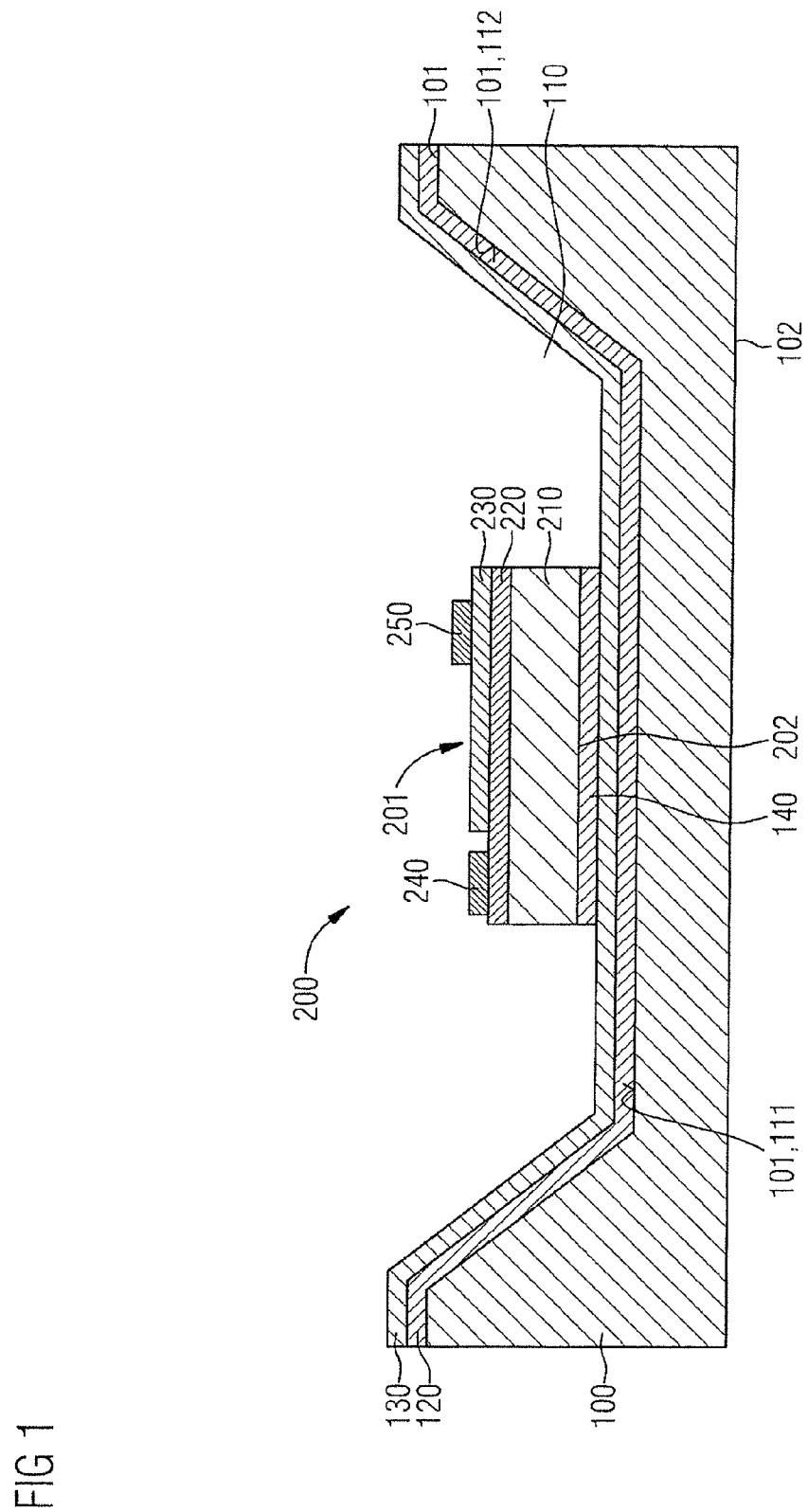
FIG. 1 shows an optoelectronic semiconductor chip arranged on a carrier.

10 Optoelectronic component
11 Top side
12 Underside
20 Optoelectronic component
100 Carrier
101 Top side
110 Depression
111 Base region
112 Wall region
120 First layer (release layer)
130 Second layer (bondable)
140 Connection layer (adhesive layer, chip bond)
150 Converter layer
200 Optoelectronic semiconductor chip
201 Top side
202 Underside
210 Substrate
220 First doped layer
230 Second doped layer
240 First contact area
250 Second contact area
260 First bonding wire
261 First bonding contact
270 Second bonding wire
271 Second bonding contact
300 Molded body
301 Top side
302 Underside
303 Covering thickness
310 Pyramidal-frustrum-shaped section
311 Cover surface
312 Lateral surface
320 First soldering contact
330 Second soldering contact
340 Solder stop element

DETAILED DESCRIPTION

An optoelectronic component comprises an optoelectronic semiconductor chip as a volume emitter. In this case, the optoelectronic semiconductor chip is embedded into an optically transparent molded body. A soldering contact is arranged at an underside of the molded body. A bonding wire forms an electrically conductive connection between an electrical contact area of the optoelectronic semiconductor chip and the soldering contact. In this case, the bonding wire is embedded into the molded body. Advantageously, this optoelectronic component can have very compact external dimensions. Since the optoelectronic semiconductor chip of this optoelectronic component is embedded into the molded body without further carriers, waste heat produced by the optoelectronic semiconductor chip can be effectively dissipated in this optoelectronic component. An electromagnetic radiation emitted by the volume emitter can advantageously pass through the optically transparent molded body of this optoelectronic component in different spatial directions.

The molded body may have a pyramidal-frustum-shaped section. In this case, a lateral surface of the pyramidal-frustum-shaped section forms a part of the underside of the molded body. Moreover, the lateral surface is at least partly covered by the soldering contact. Advantageously, the oblique wall of the underside in the pyramidal-frustum-shaped section of the molded body enables improved coupling-out of light from the optoelectronic component. Electromagnetic radiation emitted by the optoelectronic semiconductor chip can be reflected at the soldering contact covering the lateral surface to a top side of the optoelectronic component, as a result of which a wide-angled emission behavior of the optoelectronic semiconductor chip can be spatially restricted without great losses.

The optoelectronic semiconductor chip may be at least partly arranged in the pyramidal-frustum-shaped section. Advantageously, electromagnetic radiation emerging from the optoelectronic semiconductor chip can thereby be reflected from a particularly large solid angle range in the direction of a top side of the optoelectronic component and can thereby be made accessible for a use. As a result, the optoelectronic component can have low losses and a high efficiency.

The soldering contact may comprise a material having a reflectivity of at least 75% for a wavelength of a radiation that is emittable by the optoelectronic semiconductor chip. Advantageously, electromagnetic radiation emitted by the optoelectronic semiconductor chip can thereby be reflected with high reflectance at the soldering contact, as a result of which absorption and transmission losses are kept low. This advantageously contributes to a high efficiency of the optoelectronic component.

The material of the molded body may comprise filling particles. Advantageously, a coefficient of thermal expansion of the molded body can thereby be reduced. A mechanical loading acting on the molded body during the operation of the optoelectronic component is thereby reduced as a result of which a risk of damage to the optoelectronic component is reduced. The filling particles contained in the material of the molded body also increase the mechanical stability of the molded body as a result of which the optoelectronic component has a higher robustness. The filling particles contained in the material of the molded body also improve the thermal conductivity of the molded body as a result of which the latter can effectively dissipate waste heat produced by the optoelectronic semiconductor chip. A risk of damage to the optoelectronic component is advantageously reduced by this means, too.

The filling particles may comprise amorphous $SiO_2$ powder. The $SiO_2$ powder can be present in the form of spheres, for example. Such filling particles advantageously allow simple processing of the material of the molded body.

The material of the molded body may comprise converter particles that convert the wavelength of the electromagnetic radiation. Advantageously, the molded body can thereby bring about a volume conversion of a wavelength of electromagnetic radiation emitted by the optoelectronic semiconductor chip. As a result, a light color of light generatable by the optoelectronic component can advantageously be set.

The soldering contact may be in direct contact with the optoelectronic semiconductor chip. Advantageously, the optoelectronic component has small spatial dimensions, in particular a small thickness, as a result.

A top side of the optoelectronic semiconductor chip may be covered by a top side of the molded body. Advantageously, the molded body thereby protects the optoelectronic semiconductor chip embedded into the molded body and the bonding wire connected to the optoelectronic semiconductor chip against mechanical damage.

Two soldering contacts may be arranged at the underside of the molded body. In this case, two bonding wires form electrically conductive connections between two electrical contact areas of the optoelectronic semiconductor chip and the two soldering contacts. The two bonding wires are embedded into the molded body. Advantageously, the optoelectronic component can thereby be completely electrically contacted at its underside. The optoelectronic component is suitable, for example, as an SMT component for surface mounting.

A method of producing an optoelectronic component comprises steps of providing a carrier having a depression formed at a top side of the carrier, arranging a first layer at a top side of the carrier, arranging a second layer above the first layer, arranging an optoelectronic semiconductor chip, as a volume emitter, on the second layer in the depression, producing an electrically conductive connection between an electrical contact area of the optoelectronic semiconductor chip and the second layer by a bonding wire, forming an optically transparent molded body above the second layer, wherein the optoelectronic semiconductor chip and the bonding wire are embedded into the molded body, releasing the molded body from the first layer, removing the second layer from the molded body, and arranging a soldering contact at an underside of the molded body, wherein the soldering contact electrically conductively connects to the bonding wire. An optoelectronic component comprising an optoelectronic semiconductor chip embedded into a molded body, the optoelectronic semiconductor chip being a volume emitter, is advantageously obtainable by this method. Electromagnetic radiation emitted by the optoelectronic semiconductor chip can pass through the optically transparent molded body in all spatial directions. The soldering contact arranged at the underside of the optoelectronic component produced according to this method enables the optoelectronic component to be electrically contacted according to a method of surface mounting. The optoelectronic component obtainable by the method advantageously has very compact dimensions and in particular a small thickness. Since no further carriers are embedded into the molded body alongside the optoelectronic semiconductor chip in the method, the molded body of the optoelectronic component obtainable has good thermal properties.

An antistick layer or a thermally releasable adhesion layer may be used as the first layer. Advantageously, the molded body formed in the method can thereby be released from the carrier in a simple manner.

A wire-bondable layer may be used as the second layer. Advantageously, the electrically conductive connection between the electrical contact area of the optoelectronic semiconductor chip and the second layer can thereby be produced by conventional bonding.

The soldering contact may be arranged in direct contact with the optoelectronic semiconductor chip. Advantageously, the optoelectronic component obtainable by the method then has compact spatial dimensions.

After the process of arranging the optoelectronic semiconductor chip, a wavelength-converting element may be arranged on the optoelectronic semiconductor chip. Advantageously, the wavelength-converting element arranged on the optoelectronic semiconductor chip can bring about a conversion of an electromagnetic radiation emitted by the optoelectronic semiconductor chip.

Two electrically conductive connections between two electrical contact areas of the optoelectronic semiconductor chip and the second layer may be produced by two bonding wires. Two soldering contacts are then applied at the underside of the molded body. The two soldering contacts electrically conductively connect to the bonding wires. Advantageously, the two soldering contacts of the optoelectronic component produced according to this method produce electrically conductive connections to the optoelectronic semiconductor chip. The optoelectronic component obtainable according to the method can advantageously be electrically contacted according to a method of surface mounting by the soldering contacts formed at the underside.

Jointly with the optoelectronic semiconductor chip a further optoelectronic semiconductor chip may be embedded into the molded body. In this case, the molded body is subsequently divided to obtain a plurality of optoelectronic components. Advantageously, the method thereby allows parallel production of a multiplicity of optoelectronic components in common work steps as a result of which the production costs per individual optoelectronic component can drastically decrease.

The above-described properties, features and advantages and the way in which they are achieved will become clearer and more clearly understood in association with the following description of the examples explained in greater detail in association with the drawings.

FIG. 1 shows a schematic sectional illustration of a carrier 100. The carrier 100 is part of an installation that produces optoelectronic components. The carrier 100 is preferably reusable and can serve to produce a plurality of optoelectronic components one after another.

The carrier 100 has a top side 101. In the illustration in FIG. 1, the carrier is cut on a plane oriented perpendicularly to the top side 101. A depression 110 is formed at the top side 101 of the carrier 100. The depression 110 has a substantially planar base region 111 and a circumferential wall region 112. The depression 110 is pyramidal-frustum-shaped. The depression 110 thus widens proceeding from the base region 111. In a lateral direction, the depression 110 can have, for example, circular-disk-shaped or polygonal cross sections.

A first layer 120 is arranged at the top side 101 of the carrier 100. The first layer 120 covers the base region 111 of the depression 110, the wall region 112 of the depression 110 and also the remaining sections of the top side 101 of the carrier 100 outside the depression 110. The first layer 120 may have been applied to the top side 101 of the carrier 100, for example, by covering, adhesive bonding or some other coating method. The first layer 120 is preferably an antistick layer or a thermally releasable adhesion layer. The first layer 120 can comprise PTFE, for example. The first layer 120 can also be designated as a release layer.

A second layer 130 is arranged on the first layer 120. Preferably, the second layer 130 completely covers the first layer 120. The second layer 130 may have been applied, for example, in the same way as the first layer 120. The second layer 130 is preferably a metallic layer. The second layer 130 is wire-bondable. Bonding wires can therefore be fixed to the second layer 130 by a bonding method.

Above the base region 111 of the depression 110 of the carrier 100, an optoelectronic semiconductor chip 200 is arranged on the second layer 130. The optoelectronic semiconductor chip 200 connects to the second layer 130 by a connection layer 140. The optoelectronic semiconductor chip 200 has preferably been fixed on the second layer 130 by a die bonding method.

The optoelectronic semiconductor chip 200 is a light emitting diode chip (LED chip) as a volume emitter. The optoelectronic semiconductor chip 200 has a top side 201 and an underside 202 opposite the top side 201. The underside 202 of the optoelectronic semiconductor chip 200 faces the connection layer 140 and thus also the top side 101 of the carrier 100. The optoelectronic semiconductor chip 200 has a substrate 220, the underside of which forms the underside 202 of the optoelectronic semiconductor chip 200. The substrate 210 can comprise sapphire or GaN, for example.

A first doped layer 220 is arranged at a top side of the substrate 210 opposite the underside of the substrate 210. A second doped layer 230 of the optoelectronic semiconductor chip 200 is arranged above the first doped layer 220. One of the doped layers 220, 230 is a p-doped layer, and the other of the doped layers 220, 230 is an n-doped layer.

An active layer of the optoelectronic semiconductor chip 200 is formed between the first doped layer 220 and the second doped layer 230 of the optoelectronic semiconductor chip 200, the active layer being provided to emit electromagnetic radiation during operation of the optoelectronic semiconductor chip 200. The active layer of the optoelectronic semiconductor chip 200 is preferably designed to emit electromagnetic radiation having an emission wavelength in the blue spectral range. The electromagnetic radiation implemented in the active layer is emitted in all spatial directions through the optoelectronic semiconductor chip 200, in particular through the substrate 210 of the optoelectronic semiconductor chip 200.

Lateral regions of the first doped layer 220 and of the second doped layer 230 of the optoelectronic semiconductor chip 200 form the top side 201 of the optoelectronic semiconductor chip 200. A first contact area 240 and a second contact area 250 are arranged at the top side 201 of the optoelectronic semiconductor chip 200. The first contact area 240 electrically contacts the first doped layer 220. The second contact area 250 electrically contacts the second doped layer 230 of the optoelectronic semiconductor chip 200. An electrical voltage can be applied to the optoelectronic semiconductor chip 200 via the first contact area 240 and the second contact area 250 to cause the optoelectronic semiconductor chip 200 to emit electromagnetic radiation.

Figure 2:
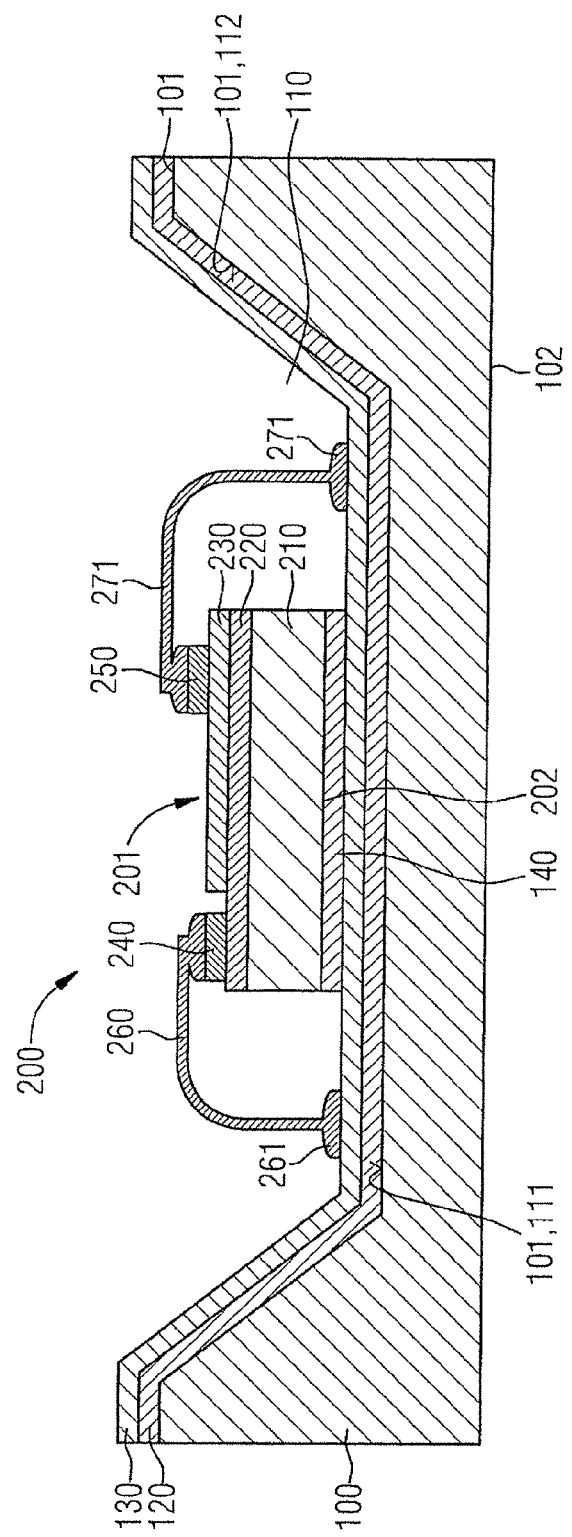
FIG. 2 shows the optoelectronic semiconductor chip after the production of bonding connections.

FIG. 2 shows a schematic sectional illustration of the carrier 100 with the optoelectronic semiconductor chip 200 arranged in the region of the depression 110 of the carrier 100 in a processing state temporally succeeding the illustration in FIG. 1. A first bonding wire 260 has been drawn from the first contact area 240 of the optoelectronic semiconductor chip 200 to the second layer 130 above the base region 111 of the depression 110 of the carrier 100 and connects to the second layer 130 by a first bonding contact 261. A second bonding wire 270 has been drawn from the second contact area 250 at the top side 201 of the optoelectronic semiconductor chip 200 to the second layer 130 above the base region 111 of the depression 110 of the carrier 100 and connects to the second layer 130 by a second bonding contact 271. The arrangement of the bonding wires 260, 270 may have been effected by a conventional bonding method.

Figure 3:
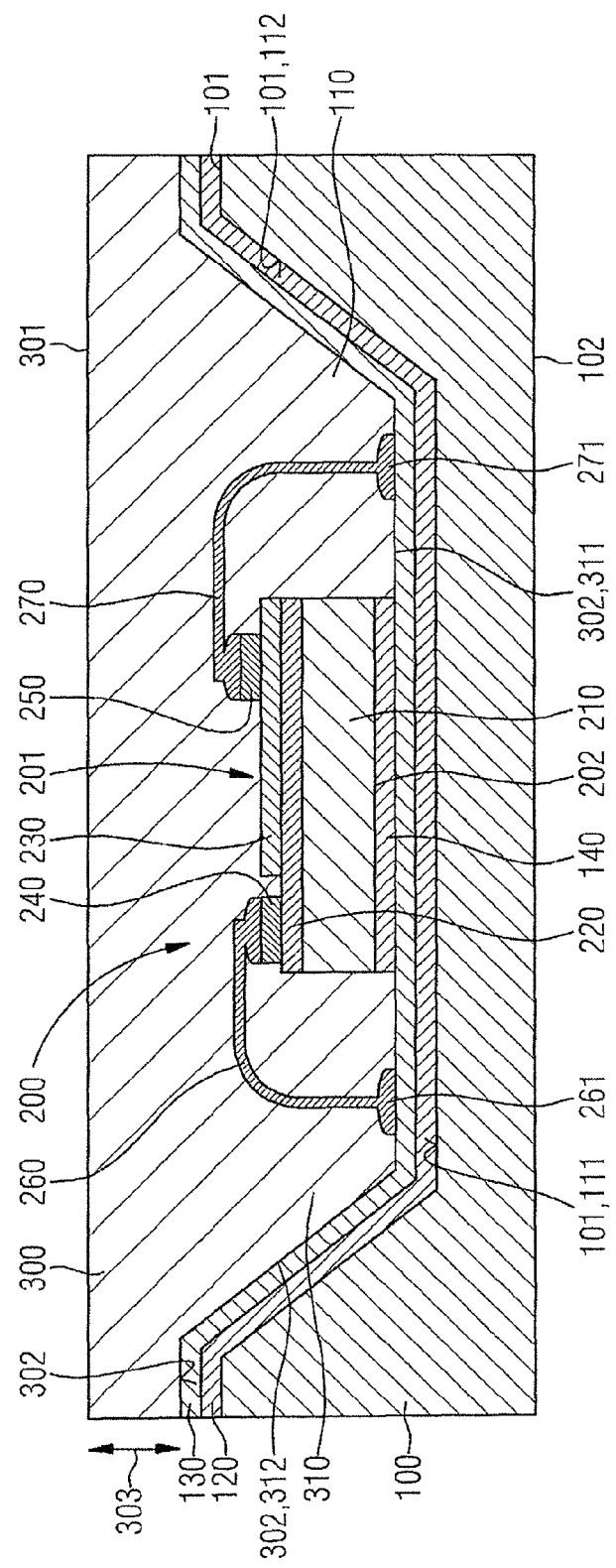
FIG. 3 shows the optoelectronic semiconductor chip embedded into a molded body.

FIG. 3 shows a schematic sectional illustration of the carrier 100 and the optoelectronic semiconductor chip 200 arranged in the region of the depression 110 of the carrier 100 in a processing state temporally succeeding the illustration in FIG. 2. A molded body 300 has been formed above the top side 101 of the carrier 100. The molded body 300 may have been formed by a hot pressing, compression or injection molding process (mold process) or some other potting process. The optoelectronic semiconductor chip 200, the first bonding wire 260 and the second bonding wire 270 have been embedded into the molded body 300 in this case.

The molded body 300 has a top side 301 and an underside 302 opposite the top side 301. The underside 302 of the molded body 300 faces the top side 101 of the carrier 100 and adjoins the second layer 130 arranged above the top side 101 of the carrier 100. The top side 301 of the molded body 300 is preferably substantially planar.

At the underside 302 of the molded body 300, a pyramidal-frustum-shaped section 310 of the molded body 300 has been formed in the region of the depression 110 of the carrier 100. The pyramidal-frustum-shaped section 310 has a substantially pyramidal-frustum-shaped volume which substantially corresponds to the volume of the depression 110 of the carrier 100. The pyramidal-frustum-shaped section 310 of the molded body 300 is delimited by a cover surface 311 and by a lateral surface 312, which form parts of the underside 302 of the molded body 300. The cover surface 311 is substantially planar and adjoins the second layer 130 above the base region 111 of the depression 110 of the carrier 100. The lateral surface 312 adjoins the second layer 130 above the wall region 112 of the depression 110 of the carrier 100. The optoelectronic semiconductor chip 200, the first bonding wire 260 and the second bonding wire 270 are substantially embedded into the pyramidal-frustum-shaped section 310 of the molded body 300.

The molded body 300 covers the second layer 130 above the top side 101 of the carrier 100 also in a lateral region arranged outside the depression 110. In the lateral region, the molded body has a covering thickness 303 between its top side 301 and its underside 302. The covering thickness 303 is preferably at least 50 µm.

The molded body 300 consists of a material substantially transparent to the electromagnetic radiation emittable by the optoelectronic semiconductor chip 200. The material of the molded body 300 can comprise silicone, for example. To increase the mechanical stability of the molded body 300, the material of the molded body 300 can be filled with particles. By way of example, the material of the molded body 300 can be filled with amorphous $SiO_2$ powder (fused silica powder) in the form of spheres. Besides increasing the mechanical stability of the molded body 300, such a filling of the material of the molded body 300 brings about a reduction of a coefficient of thermal expansion of the molded body 300, as a result of which the latter may be subjected to lower mechanical loadings during operation, which may increase the lifetime of the molded body 300. In addition, a thermal conductivity of the molded body 300 increases as a result of the filling of the material of the molded body 300 as a result of which the latter can more effectively dissipate waste heat produced by the optoelectronic semiconductor chip 200. The positive properties mentioned develop all the more distinctly, the higher the degree of filling of the material of the molded body 300. However, production and processing of the molded body 300 are also made more difficult as the degree of filling of the material of the molded body increases. Preferably, the material of the molded body 300 has a degree of filling of at least 80 percent by weight.

The material of the molded body 300 can additionally comprise converter particles provided for a wavelength conversion. Such converter particles can convert electromagnetic radiation having the wavelength emitted by the optoelectronic semiconductor chip 200 into electromagnetic radiation having other wavelengths. As a result, blue light emitted by the optoelectronic semiconductor chip 200 can be converted into white light, for example. The converter particles can be arranged in a manner distributed in the entire volume of the molded body 300. The molded body 300 then brings about a volume conversion. In the context of this description, a molded body 300 comprising such converter particles is also regarded as optically transparent.

Figure 4:
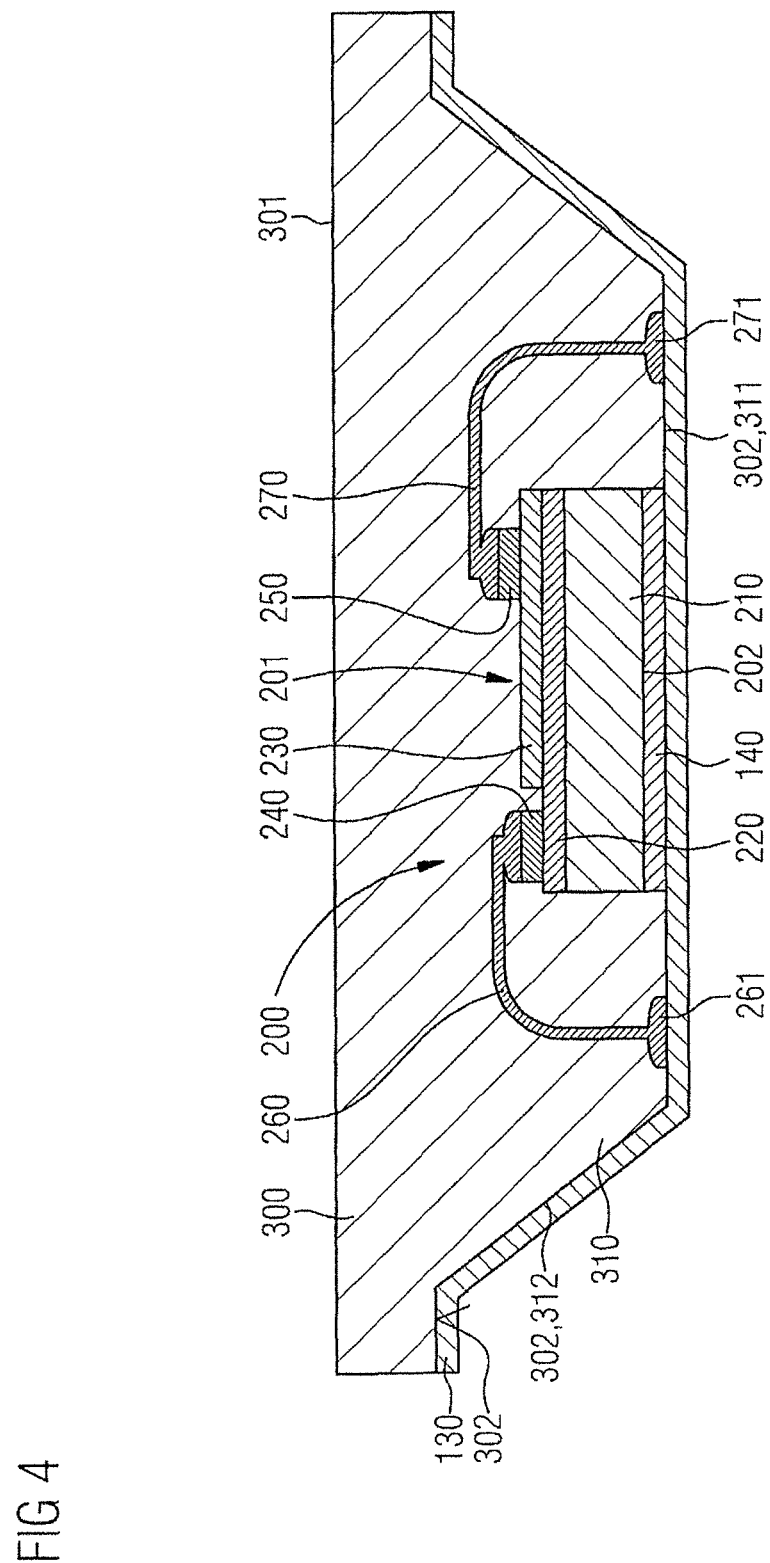
FIG. 4 shows the molded body after release of the carrier.

FIG. 4 shows a schematic sectional illustration of the molded body 300 with the embedded optoelectronic semiconductor chip 200 in a processing state temporally succeeding the illustration in FIG. 3. The molded body 300, jointly with the second layer 130, has been released from the first layer 120 and the carrier 100. The second layer 130 is still arranged at the underside 302 of the molded body 300.

The release of the molded body 300 may have taken place automatically after formation of the molded body 300 during cooling of the molded body 300. During cooling, the molded body 300 may have contracted to a greater extent than the carrier 100. In this case, the release may have been supported by an antistick property of the first layer 120. Alternatively or additionally, the release in the region of the first layer 120 may also have been supported by a thermal influence.

Figure 5:
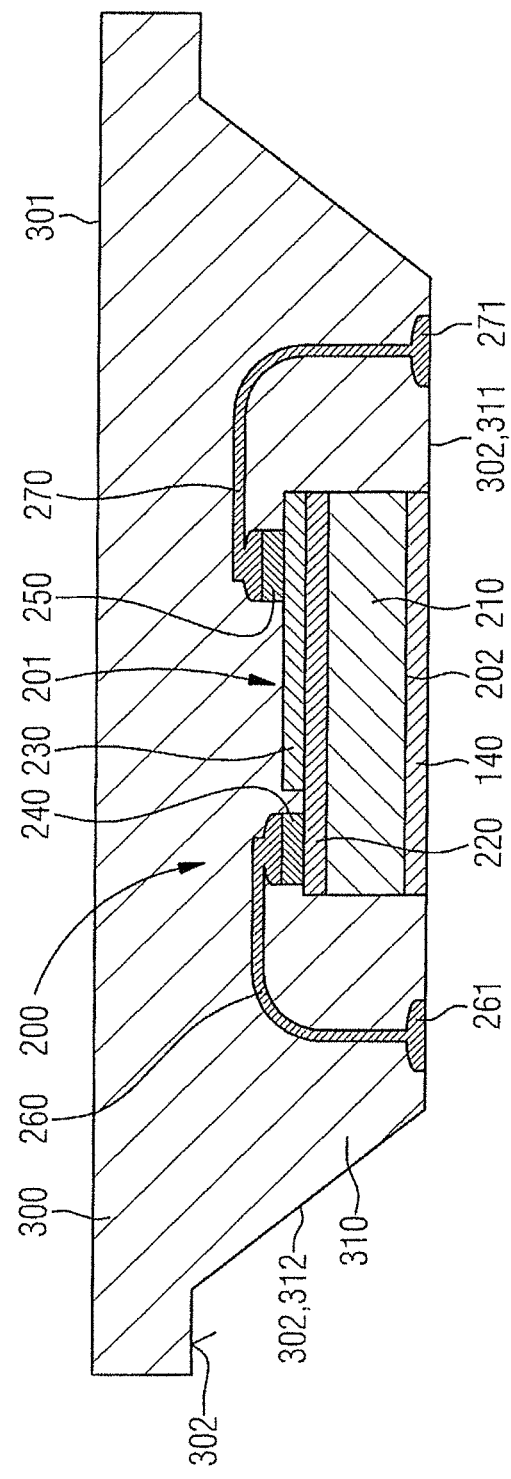
FIG. 5 shows the molded body after release of a bondable layer.

FIG. 5 shows a schematic sectional illustration of the molded body 300 with the embedded optoelectronic semiconductor chip 200 in a processing state temporally succeeding the illustration in FIG. 4. The second layer 130 has been removed from the underside 302 of the molded body 300. Removal of the second layer 130 may have been carried out by an etching process, for example. After removal of the second layer 130, the connection layer 140 arranged at the underside 202 of the optoelectronic semiconductor chip 200 is now accessible at the cover surface 311 of the truncated-pyramid-shaped section 310 of the molded body 300.

Figure 6:
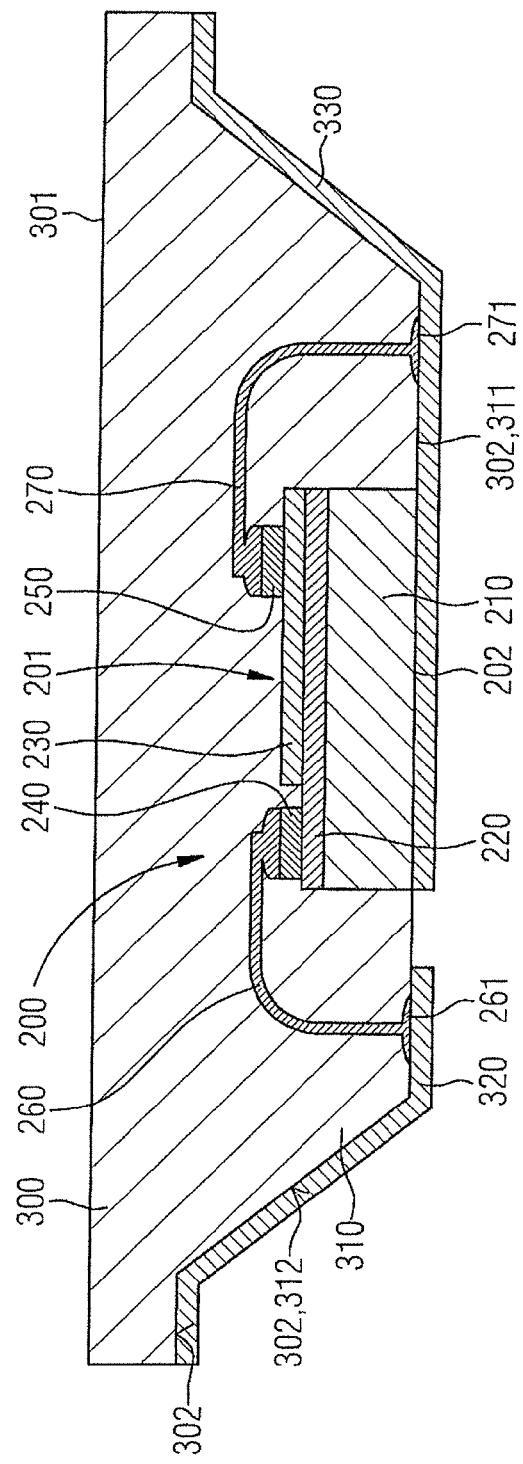
FIG. 6 shows the molded body after application of soldering contacts.

FIG. 6 shows a sectional illustration of the molded body 300 and the optoelectronic semiconductor chip 200 embedded therein in a processing state temporally succeeding the illustration in FIG. 5. The connection layer 140 has been removed from the underside 102 of the optoelectronic semiconductor chip 200. This may have been carried out by grinding over the underside 102 of the molded body 300. In this case, a part of the molded body 300 has also been removed in the region of the cover surface 311 of the pyramidal-frustum-shaped section 310 of the molded body 300. Parts of the first bonding contact 261 and of the second bonding contact 271 may also have been ground away in this case. Alternatively, however, the connection layer 140 may also have been removed by an etching process or by dissolution by a solvent.

After removal of the connection layer 140, a first soldering contact 320 and a second soldering contact 330 have been formed at the underside 302 of the molded body 300. The first soldering contact 320 and the second soldering contact 330 are spaced apart from one another in a lateral direction of the underside 302 of the molded body 300 and are thereby electrically insulated from one another. The first soldering contact 320 and the second soldering contact 330 each cover sections of the lateral surface 312 and of the cover surface 311 of the pyramidal-frustum-shaped section 310 at the underside 302 of the molded body 300. A gap formed between the first soldering contact 320 and the second soldering contact 330 in a lateral direction is preferably narrow in comparison with the extent of the soldering contacts 320, 330 such that overall a large proportion of the underside 302 of the molded body 300 is covered by either the first soldering contact 320 or the second soldering contact 330.

The underside 202 of the optoelectronic semiconductor chip 200 exposed after the removal of the connection layer 140 is also covered by the first soldering contact 320 or the second soldering contact 330. In the example illustrated in FIG. 6, the second soldering contact 330 covers the underside 202 of the optoelectronic semiconductor chip 200. In this case, the second soldering contact 330 is in direct contact with the underside 202 of the optoelectronic semiconductor chip 200.

The geometrical shape of the first soldering contact 320 and of the second soldering contact 330 in a lateral direction of the underside 302 of the molded body 300 was defined by a photolithographic method. The first soldering contact 320 and the second soldering contact 330 may have been applied to the underside 302 of the molded body 300, for example, by an electrolytic method or by a method of physical vapor deposition, for example, by sputtering or vapor deposition.

The first soldering contact 320 and the second soldering contact 330 comprise an electrically conductive material, preferably a metal. The first soldering contact 320 and the second soldering contact 330 can be formed, for example, as a layer stack comprising successive layers in a direction perpendicular to the underside 302 of the molded body 300, the layers comprising silver, nickel, palladium and gold.

At the underside 302 of the molded body 300, the first soldering contact 320 electrically conductively connects to the first bonding contact 261 and thus also electrically conductively connects to the first contact area 240 of the optoelectronic semiconductor chip 200 via the first bonding wire 260. At the underside 302 of the molded body 300, the second soldering contact 330 electrically conductively contacts the second bonding contact 271 and thereby also electrically conductively contacts the second contact area 250 of the optoelectronic semiconductor chip 200 via the second bonding wire 270. Electrical voltage can thus be applied to the optoelectronic semiconductor chip 200 via the first soldering contact 320 and the second soldering contact 330. The first soldering contact 320 and the second soldering contact 330 are suitable for electrical linking according to a method of surface mounting, for example, electrical linking by reflow soldering.

The first soldering contact 320 and the second soldering contact 330 have a high optical reflectivity for electromagnetic radiation having the wavelength emittable by the optoelectronic semiconductor chip 200. If the molding body 300 comprises embedded converter particles, then the first soldering contact 320 and the second soldering contact 330 preferably also have a high reflectivity for electromagnetic radiation having wavelengths emitted by the converter particles. Preferably, the first soldering contact 320 and the second soldering contact 330 have a reflectivity of at least 75% in the wavelength ranges mentioned. For this purpose, the soldering contacts 320, 330 can comprise silver, for example, on their side facing the molded body 300.

Electromagnetic radiation emitted by the optoelectronic semiconductor chip 200 in the direction of the underside 302 of the molded body 300 is reflected at the soldering contacts 320, 330 in the direction of the top side 301 of the molded body 300. At the top side 301 of the molded body 300, the electromagnetic radiation can emerge from the molded body 300 and be used. Since the underside 202 of the optoelectronic semiconductor chip 200 directly adjoins the second soldering contact 330, electromagnetic radiation emerging from the optoelectronic semiconductor chip 200 through the underside 202 of the optoelectronic semiconductor chip 200 is advantageously also reflected in the direction of the top side 301 of the molded body 300. The beveled arrangement of the lateral surface 312 of the pyramidal-frustum-shaped section 310 of the molded body 300 additionally has the effect that electromagnetic radiation emerging from the optoelectronic semiconductor chip 200 in a lateral direction is also reflected in the direction of the top side 301 of the molded body 300. Overall, as a result, a large portion of the electromagnetic radiation emerging from the optoelectronic semiconductor chip 200 in all spatial directions is guided to the top side 301 of the molded body 300 and made accessible for use. In this regard, only low losses of the electromagnetic radiation arise.

Figure 7:
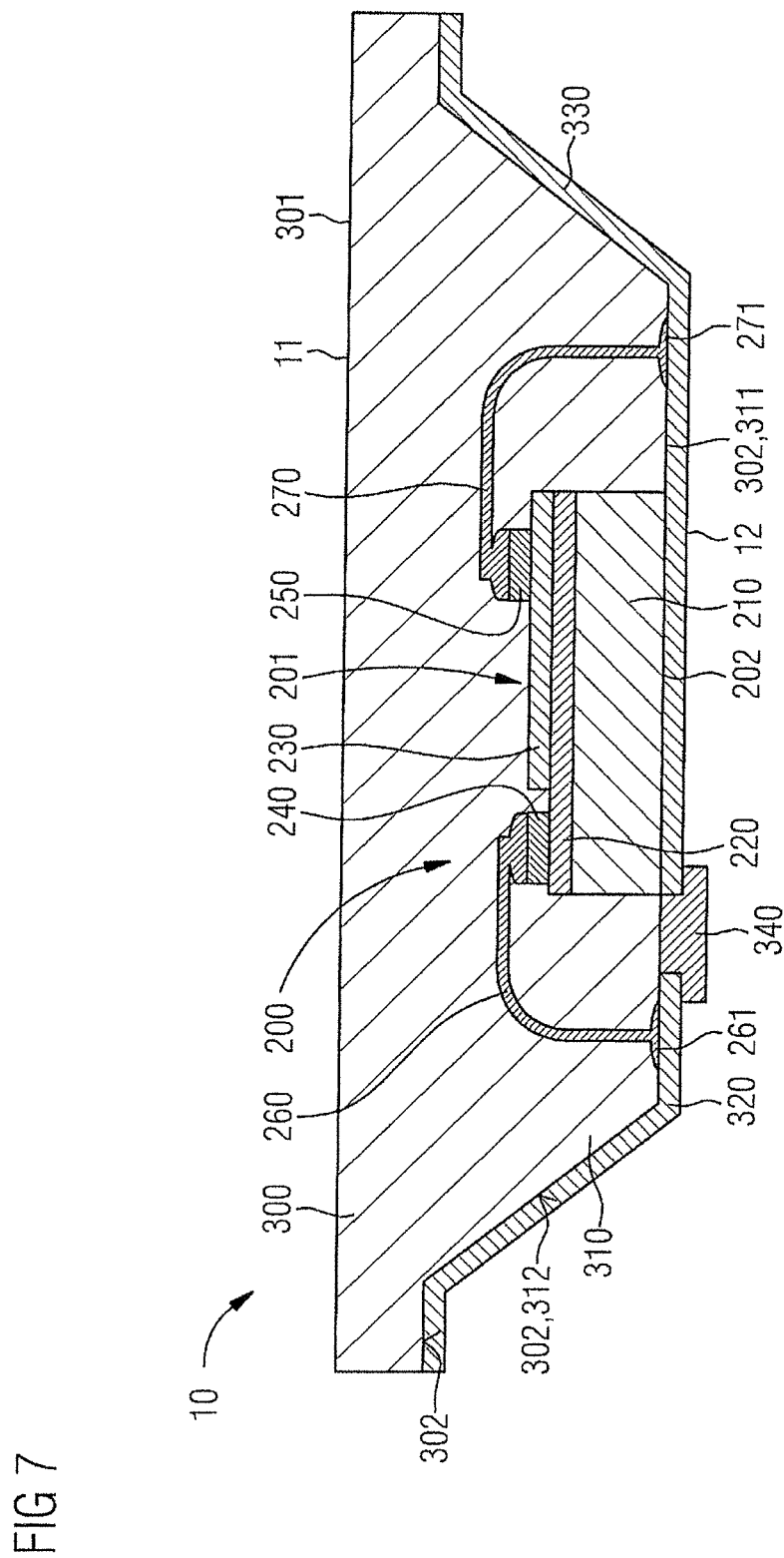
FIG. 7 shows the molded body after formation of a solder stop element.

FIG. 7 shows a schematic sectional illustration of the molded body 300 with the embedded optoelectronic semiconductor chip 200 in a processing state temporally succeeding the illustration in FIG. 6. As a result of further processing, a completed optoelectronic component 10 has arisen from the molded body 300 with the optoelectronic semiconductor chip 200. The top side 301 of the molded body 300 forms a top side 11 of the optoelectronic component 10. The underside 302 of the molded body 300 with the soldering contacts 320, 330 arranged at the underside 302 of the molded body 300 forms an underside 12 of the optoelectronic component 10. The optoelectronic component 10 is a light emitting diode component (LED component).

Proceeding from the processing state illustrated in FIG. 6, a solder stop element 340 was applied at the underside 302 of the molded body 300 between the first soldering contact 320 and the second soldering contact 330. The soldering stop element 340 can comprise a solder resist, for example. The solder stop element 340 can prevent an electrical short circuit from arising between the first soldering contact 320 and the second soldering contact 330 during soldering of the optoelectronic component 10. The solder stop element 340 can also be omitted, however.

The optoelectronic component 10 is suitable as an SMT component for surface mounting. In this case, the soldering contacts 320, 330 of the optoelectronic component 10 can be electrically contacted, for example, by reflow soldering.

The method of producing the optoelectronic component 10 as described with reference to FIGS. 1 to 7 is suitable for a parallel production of a plurality of optoelectronic components 10 in common work operations. For this purpose, a plurality of depressions 110 can be arranged at the top side 101 of the carrier 100, the depressions forming a regular grid, for example, in a lateral direction of the top side 101 of the carrier 100. The first layer 120 and the second layer 130 cover the entire top side 101 of the carrier 100, thus also in all depressions 110 of the carrier 100. An optoelectronic semiconductor chip 200 is arranged in the base region 111 of each depression 110 and connects to the second layer 130 by two bonding wires 260, 270. All the optoelectronic semiconductor chips 200 are embedded into a common molded body 300. The common molded body 300 has a plurality of pyramidal-frustum-shaped sections 310, into each of which an optoelectronic semiconductor chip 200 is embedded. After release of the common molded body 300 from the top side 101 of the carrier 100 and removal of the second layer 130 and the connection layers 140, a plurality of soldering contacts 320, 330 are applied at the underside 302 of the common molded body 300. In this case, a first soldering contact 320 and a second soldering contact 330 are each applied per embedded optoelectronic semiconductor chip 200. The application of the solder stop element 340 is also carried out in parallel and jointly for all the optoelectronic semiconductor chips 200 embedded into the common molded body 300. The common molded body is then divided into a plurality of optoelectronic components 10.

It is also possible to form an optoelectronic component 10 with more than one embedded optoelectronic semiconductor chip 200. For this purpose, during production of the optoelectronic component 10, more than one optoelectronic semiconductor chip 200 is arranged jointly in a depression 110 of the carrier 100.

Figure 8:
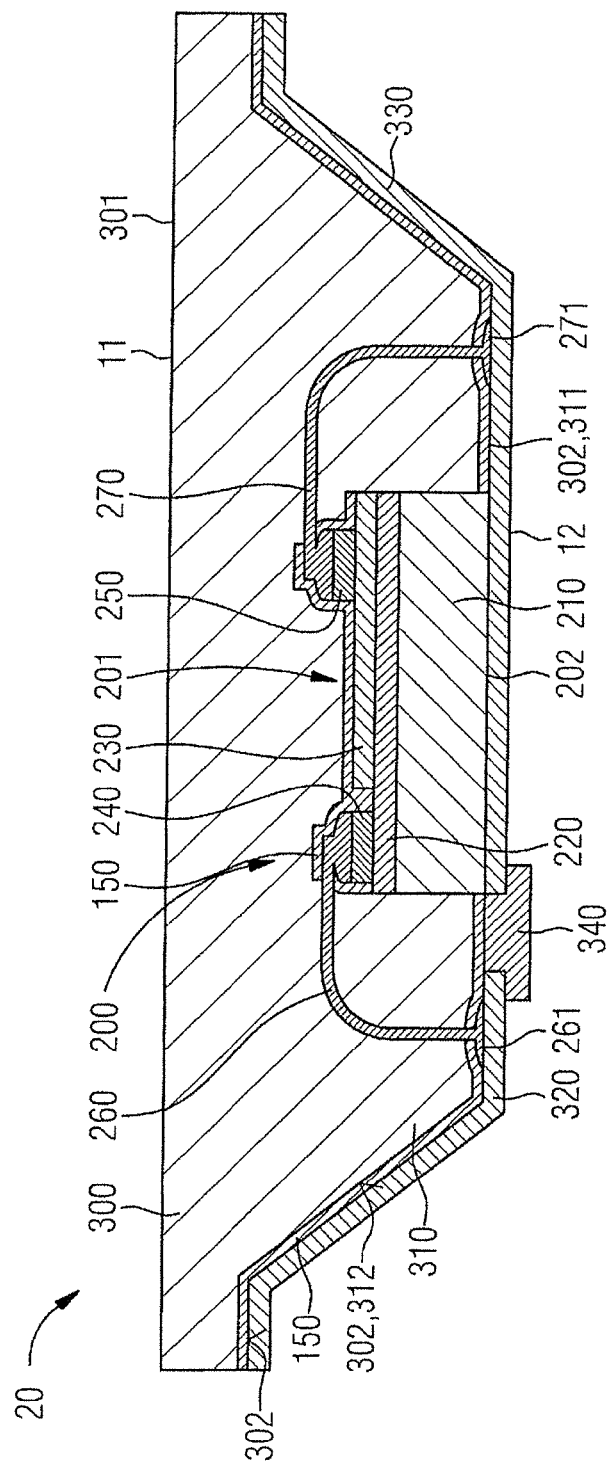
FIG. 8 shows an optoelectronic component including a converter layer arranged on a top side of an optoelectronic semiconductor chip.

FIG. 8 shows a schematic sectional illustration of an optoelectronic component 20. The optoelectronic component 20 has large correspondences with the optoelectronic component 10 from FIG. 7. Corresponding component parts are provided with the same reference signs in FIGS. 7 and 8. The method of producing the optoelectronic component 20 also corresponds, apart from the differences explained below, to the method of producing the optoelectronic component 10 as explained with reference to FIGS. 1 to 7.

To produce the optoelectronic component 20, in the processing state illustrated in FIG. 2 before formation of the molded body 300, a converter layer 150 is deposited on the top side 201 of the optoelectronic semiconductor chip 200 and the exposed lateral regions of the second layer 130. The converter layer 150 can be deposited electrophoretically or by spraying, for example. The converter layer 150 comprises a converter material that converts a wavelength of electromagnetic radiation emitted by the optoelectronic semiconductor chip 200.

After the converter layer 150 has been applied, the molded body 300 is formed, as was described with reference to FIG. 3. In this case, the molded body 300 is formed from a material which does not comprise converter particles. The rest of the production of the optoelectronic component 20 takes place analogously to the production of the optoelectronic component 10.

As an alternative to applying the converter layer 150, it is also possible, in the processing state illustrated in FIG. 2, to arrange a laminar converter element (chip level converter) on the top side 201 of the optoelectronic semiconductor chip 200. In this case, the further processing takes place analogously to the production of the optoelectronic component 20.

Our components and methods have been illustrated and described more specifically on the basis of the preferred examples. Nevertheless, the disclosure is not restricted to those examples. Rather, other variations can be derived therefrom by those skilled in the art, without departing from the scope of protection of the disclosure as reflected in the appended claims.

The invention claimed is:

1. An optoelectronic component comprising an optoelectronic semiconductor chip embodied as a volume emitter,
   wherein the optoelectronic semiconductor chip is embedded into an optically transparent molded body,
   a soldering contact is arranged at an underside of the molded body,
   a bonding wire forms an electrically conductive connection between an electrical contact area of the optoelectronic semiconductor chip and the soldering contact,
   the bonding wire is embedded into the molded body,
   the molded body has a pyramidal-frustum-shaped section,
   a lateral surface of the pyramidal-frustum-shaped section forms a part of the underside of the molded body,
   the lateral surface is at least partly covered by the soldering contact,
   the underside of the molded body with the soldering contact arranged at the underside of the molded body forms an underside of the optoelectronic component, and
   a wavelength converter layer is interposed between the lateral surface of the pyramidal-frustum-shaped section and the soldering contact and between a light emitting surface of the semiconductor chip and the optically transparent molded body, wherein the wavelength converter layer is in contact with a solder stop element in a recess within the soldering contact.

2. The optoelectronic component as claimed in claim 1, wherein the optoelectronic semiconductor chip is at least partly arranged in the pyramidal-frustum-shaped section.

3. The optoelectronic component as claimed in claim 1, wherein the soldering contact comprises a material having a reflectivity of at least 75% for a wavelength of a radiation emittable by the optoelectronic semiconductor chip.

4. The optoelectronic component as claimed in claim 1, wherein the material of the molded body comprises filling particles.

5. The optoelectronic component as claimed in claim 4, wherein the filling particles comprise amorphous $SiO_2$ powder.

6. The optoelectronic component as claimed in claim 1, wherein the material of the molded body comprises converter particles that convert a wavelength of an electromagnetic radiation.

7. The optoelectronic component as claimed in claim 1, wherein the soldering contact directly contacts the optoelectronic semiconductor chip.

8. The optoelectronic component as claimed in claim 1, wherein a top side of the optoelectronic semiconductor chip is covered by a top side of the molded body.

9. The optoelectronic component as claimed in claim 1, wherein two soldering contacts are arranged at the underside of the molded body,
   two bonding wires form electrically conductive connections between two electrical contact areas of the optoelectronic semiconductor chip and the two soldering contacts, and
   the two bonding wires are embedded into the molded body.

* * * * *